United States Patent [19]
Belenky et al.

[11] Patent Number: 5,539,762
[45] Date of Patent: Jul. 23, 1996

[54] ARTICLE COMPRISING A SEMICONDUCTOR LASER WITH CARRIER STOPPER LAYER

[75] Inventors: Gregory Belenky, Scotch Plains; Rudolf F. Kzarinov, Martinsville, both of N.J.; Keisuke Kojima, Allentown; Claude L. Reynolds, Jr., Sinking Spring, both of Pa.

[73] Assignee: AT&T Corp., Murray Hill, N.J.

[21] Appl. No.: 440,150

[22] Filed: May 12, 1995

[51] Int. Cl.⁶ .................................. H01S 3/19
[52] U.S. Cl. .......................... 372/46; 372/45
[58] Field of Search ...................... 372/44, 45, 46

[56] References Cited

U.S. PATENT DOCUMENTS

| | | | |
|---|---|---|---|
| 5,003,548 | 3/1991 | Boun et al. | 372/45 |
| 5,448,585 | 5/1995 | Belenky et al. | 372/45 |
| 5,465,263 | 11/1995 | Bour et al. | 372/23 |

OTHER PUBLICATIONS

"Growth and Characterization of High Yield, Reliable, High-Power, High-Speed, InP/InGaAsP Capped Mesa Buried Heterostructure Distributed Feedback (CMBH-DFB) Lasers", by J. L. Zilko et al, *IEEE Journal of Quantum Electronics*, vol. 25, No. 10, Oct. 1989, pp. 2091–2095.
"Building Better Diode Lasers", by H. Tanaka, *Laser Optics & Optronics*, Aug. 1991, pp. 30–34.

*Primary Examiner*—James W. Davie
*Attorney, Agent, or Firm*—Eugen E. Pacher

[57] ABSTRACT

A novel InP-based semiconductor laser comprises an unpatterned active region that is essentially co-extensive with the substrate of the laser, an electron stopper layer, and a separate confinement heterostructure (SCH) layer that has a portion of thickness greater than the thickness of the remainder of the SCH layer. The difference in thickness serves to provide lateral guiding of the laser mode. A patterned current blocking layer is disposed on the SCH layer, with a window in the blocking layer defining the region of increased thickness of the SCH layer. The inventive laser is readily manufacturable and can have improved properties.

4 Claims, 1 Drawing Sheet

ARTICLE COMPRISING A SEMICONDUCTOR LASER WITH CARRIER STOPPER LAYER

FIELD OF THE INVENTION

This invention pertains to semiconductor lasers, and to articles that comprise such a laser.

BACKGROUND OF THE INVENTION

Various types of semiconductor lasers are known. Among these is the so-called "buried heterostructure" (BH) type, which is frequently used in optical fiber telecommunication systems. See, for instance, J. L. Zilko et at., *J. Quantum Electronics*, Vol. 25, p. 2091 (1989).

Although it was possible to achieve impressive results (e.g., high power, high speed single mode uncooled operation) with BH lasers, these lasers have shortcomings. For instance, the manufacturing process of conventional BH lasers includes etching of the layer structure through the active layer to form a "mesa", followed by growth of a multilayer current blocking structure that covers the side walls of the mesa. This technological approach requires precise control of the blocking layers, and is a potential source of defects at the active layer/blocking structure interfaces. Such defects can inter alia lead to early device failure and are highly undesirable. Furthermore, achievement of good current confinement is difficult, requiring a complex confinement structure that is inter alia designed to provide a reverse-biased p-n junction under normal forward bias of the laser.

In view of the importance of single transverse mode semiconductor lasers in many fields of technology (e.g., optical fiber communication systems), it would be highly desirable to have available a readily manufacturable laser having improved properties. In particular, it would be highly desirable to have available a laser that has an unpatterned, uniform active layer, and that can achieve current confinement with a relatively simple blocking structure. This application discloses such a laser.

Lasers that have an unpatterned, uniform active layer are known. See, for instance, H. Tanaka, *Laser Optics & Optronics*, August 1991, p. 30 which discloses such a laser that achieves current confinement by means of a patterned (n-GaAs) blocking layer.

A recently filed U.S. patent application (Ser. No. 08/267,727, "Article Comprising a Quantum Well Laser", filed Jun. 29, 1994 by G. L. Belenky et al., U.S. Pat. No. 5,448,585) discloses semiconductor lasers that comprise an electron stopper layer that is disposed between the active region and the p-side waveguide layer.

SUMMARY OF THE INVENTION

In a broad aspect the invention is embodied in lasers of relatively simple structure that can be single transverse mode lasers, with lateral confinement of both light and current achieved without etching through the active region of the laser.

More specifically, the invention is embodied in an article (e.g., an optical transmitter) that comprises a semiconductor laser that comprises a multilayer semiconductor structure on a substrate, and also comprises contacts that facilitate flowing a current through the multilayer structure such that the laser emits radiation of a predetermined wavelength. The multilayer structure comprises first and second cladding regions, an active region disposed between the cladding regions, and a carrier stopper layer disposed between the active region and the second cladding region. The first and second cladding regions comprise material of a first and second conductivity type, respectively.

Significantly, the active region of the laser is unpatterned, of essentially uniform thickness and co-extensive with the substrate. The multilayer structure further comprises first and second SCH (separate optical confinement heterostructure) layers, and current blocking means that comprise a patterned blocking layer that is disposed between the second SCH layer and at least a portion of the second cladding region. The first SCH layer is disposed between the first cladding region and the active region, and the second SCH layer is disposed between the carrier stopper layer and the second cladding region. The second SCH layer has a portion that has a thickness that is greater than that of the remainder of the second SCH layer, with the difference in thickness being sufficient to result in substantial lateral guiding of at least one radiation mode of the laser. By a "SCH" layer we mean herein a layer of material, with energy gap larger than that of the active layer and smaller than that of the cladding layer, which serves to improve optical confinement.

By way of example, the laser is a InP-based laser, the first and second conductivity types are n- and p-type, respectively, the carrier stopper layer is an i- or p-type electron stopper layer, and the patterned blocking region comprises an i-type sub-region between two n-doped sub-regions.

The figures are not necessarily drawn to scale or in proportion.

DETAILED DESCRIPTION OF PREFERRED EMBODIMENTS

Figure 1:
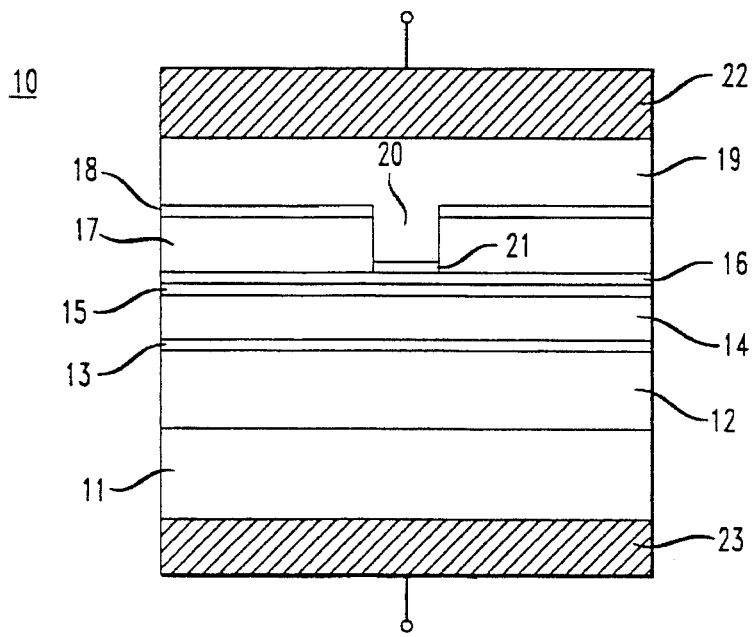
FIG. 1 schematically shows the layer structure of an exemplary laser according to the invention.

FIG. 1 schematically shows relevant aspects of the layer structure of a laser (10) according to the invention. On a conventional n-type InP substrate 11 (typically comprising bulk InP material with an epitaxial InP buffer layer thereon) are disposed, in sequence, n-type InP first cladding layer 12, essentially undoped- or n-type InGaAsP first SCH layer 13, active region 14, essentially undoped or p-type InAlAs electron stopper layer 15, and p-type InGaAsP second SCH layer 16. The active region will typically contain one or more quantum wells but could be a bulk active region, and typically comprises undoped or p-type material.

As can be seen from FIG. 1, layers 12–16 of the layer structure are unpatterned, and are substantially co-extensive with the substrate 11. That is to say, during laser fabrication layers 12–16 are deposited in conventional fashion on a conventional substrate, e.g., a 2-inch diameter InP wafer, and layers 12–16 are not patterned (etched) during laser fabrication.

The layer structure further comprises patterned current blocking layer 17 that defines the lateral position of the carrier recombination region. Although layer 17 could be doped uniformly n-type, it preferably is n-i-n, to yield improved current confinement to the "window" 20 in the blocking layer. The window can be etched through layer 17 by conventional means. By "i-material" (or equivalent terms) we typically mean here Fe-doped InP.

Subsequent to etching of window 20, a further SCH layer 18 is deposited uniformly on the wafer. The layer typically is p-InGaAsP, of substantially the same composition as the second SCH layer 16. As those skilled in the art will readily appreciate, in window 20 the SCH layer material is not deposited on blocking layer 17 but instead on second SCH layer 16, resulting in formation of a region 21 of increased thickness of the second SCH layer. Appropriate choice of composition and thickness of the portion 21 of the second SCH layer can provide lateral guiding of the desired lasing mode during laser operation.

On further SCH layer 18 is disposed second cladding layer 19, typically p-type InP. The cladding layer material is deposited by a conventional process such that window 20 above 21 is substantially uniformly filled with cladding material. Finally, the laser comprises conventional contacts 22 and 23 that facilitate flowing a current through the laser structure.

Figure 2:
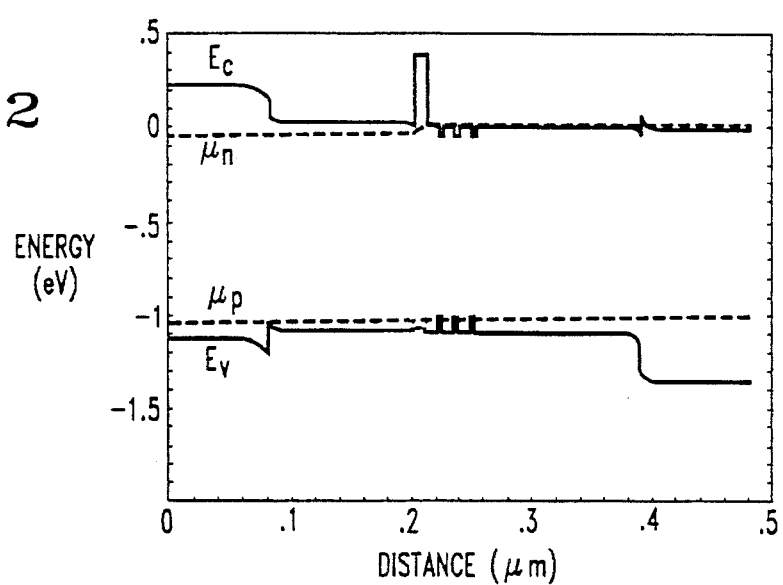
FIG. 2 shows the band diagram of the laser structure of FIG. 1 under normal forward bias.

FIG. 2 shows the band structure (under normal forward bias) of a laser substantially as shown in FIG. 1, as calculated by the known PADRE program. FIG. 2 shows that the leakage of holes out of the active region in the direction of growth is limited by the discontinuity of the valence band between InP and the waveguide material. The thermionic flow of electrons out of the device active region into blocking and cladding layers is drastically reduced by the InAlAs stopper layer thereby reducing electrical leakage, without substantially impeding the injection of carriers into the active region.

Figure 3:
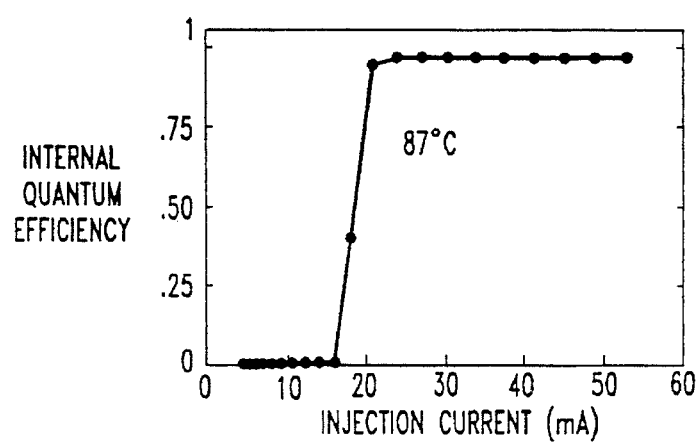
FIG. 3 shows computed data of internal efficiency vs. injection current for an exemplary laser according to the invention.

FIG. 3 shows the result of a two-dimensional calculation of the value of internal quantum efficiency η of a laser according to FIGS. 1 and 2. As can be seen, the value of η is close to unity even at 87° C. and a high level of injection current, indicative of efficient device operation.

The presence of electron stopper layer 15 can provide not only enhancement of the laser performance due to an increase of the internal efficiency, but also can provide reduction of the optical mode width. Furthermore, it can result in significant improvement of the properties of the current blocking structure. Since the energy barrier for the electrons can reach 0.35 eV, double injection can be substantially eliminated.

Example I

Lasers are produced by conventional low pressure metal organic chemical vapor deposition (MOCVD) as follows:

On a conventional n-InP substrate are grown in sequence a 0.75 μm n-InP buffer layer (that functions as cladding layer), a 50 nm lattice matched n-InGaAsP SCH layer, an active layer, a 20 nm InAlAs electron stopper layer, a 50 nm p-InGaAsP SCH layer, and a 0.75 μm n-InP blocking layer. The n-layers are doped at levels of $1–2\times10^{18}/cm^3$, and the p-SCH layer is doped at a level of $5\times10^{17}/cm^3$. The active layer has 9 quantum wells (7.0 nm) that are compressively strained about 1.5%, with 10 nm barriers that are lattice matched and doped p-type at about $5\times10^{17}/cm^3$. The wafer is then patterned by a conventional technique to form spaced-apart parallel grooves (about 2 μm wide) in the n-InP blocking layer. After removal of the mask material, the wafer is re-inserted into the MOCVD reactor, and the following layers are grown in sequence: a 15 nm p-InGaAsP SCH layer, a 0.6 μm p-InP cladding layer, and a p-InGaAs contact layer. The cladding layer is doped at a level of about $1–2\times10^{18}/cm^3$, and the contact layer at about $1\times10^{19}/cm^3$. Subsequently, the wafer is metallized in conventional manner to provide contacts, cleaved parallel to the "grooves", and the resulting bars are cleaved into bars of the desired lengths. The thus produced lasers according to the invention are tested and perform substantially as described above.

Example II

Lasers are produced substantially as described in the preceding example, except that the n-InP blocking layer is replaced by a n-i-n layer. The 0.25 μm n-regions are doped to $1–2\times10^{18}/cm^3$, and the 0.3 μm i-region is doped with sufficient Fe to result in semi-insulating material. The lasers perform substantially as described above. Doping with Fe to form an i-region is conventional in MOCVD.

The invention claimed is:

1. An article comprising a laser comprising a multilayer semiconductor structure on a substrate and contacts that facilitate flowing a current through the multilayer structure; the multilayer structure comprising
   a) a first cladding region comprising material of a first conductivity type;
   b) a second cladding region comprising material of a second conductivity type;
   c) an active region disposed between said cladding regions;
   d) a carrier stopper layer disposed between the active region and the second cladding region;
characterized in that
   e) the active region is unpatterned, of essentially uniform thickness, and essentially co-extensive with the substrate; and
   f) the multilayer structure further comprises
      i) a first SCH layer disposed between the first cladding region and the active region;
      ii) a second SCH layer disposed between the carrier stopper layer and the second cladding region, the second SCH layer having a portion of thickness greater than that of the remainder of the second SCH layer, the difference in thickness being sufficient to result in substantial lateral guiding of a lateral radiation mode of the laser; and
      iii) current blocking means comprising a patterned blocking region disposed between the second SCH layer and at least a portion of the second cladding region.

2. An article according to claim 1, wherein the first cladding layer is n-type, the first SCH layer is essentially undoped- or n-type, the active layer comprises undoped or p-type material, the carrier stopper layer is an electron stopper layer that is essentially undoped-or p-type, and the second SCH layer is p-type.

3. An article according to claim 2, wherein said patterned current blocking layer comprises n-type material and is disposed between the second SCH layer and the second cladding layer, with a window extending through the current blocking layer, said window defining the portion of greater thickness of the second SCH layer.

4. An article according to claim 3, wherein the patterned current blocking layer comprises two n-type sublayers separated by an i-sublayer.

* * * * *